US011316075B2

(12) United States Patent
Sorg et al.

(10) Patent No.: US 11,316,075 B2
(45) Date of Patent: Apr. 26, 2022

(54) OPTOELECTRONIC SEMICONDUCTOR COMPONENT, AND METHOD FOR PRODUCING AN OPTOELECTRONIC SEMICONDUCTOR COMPONENT

(71) Applicant: OSRAM OLED GmbH, Regensburg (DE)

(72) Inventors: Jörg Erich Sorg, Regensburg (DE); Christoph Koller, Nittendorf (DE); Andreas Dobner, Wenzenbach (DE)

(73) Assignee: OSRAM OLED GMBH, Regensburg (DE)

( * ) Notice: Subject to any disclaimer, the term of this patent is extended or adjusted under 35 U.S.C. 154(b) by 258 days.

(21) Appl. No.: 16/754,720

(22) PCT Filed: Oct. 8, 2018

(86) PCT No.: PCT/EP2018/077318
§ 371 (c)(1),
(2) Date: Apr. 8, 2020

(87) PCT Pub. No.: WO2019/072761
PCT Pub. Date: Apr. 18, 2019

(65) Prior Publication Data
US 2020/0303594 A1 Sep. 24, 2020

(30) Foreign Application Priority Data
Oct. 9, 2017 (DE) .......................... 102017123413.6

(51) Int. Cl.
H01L 33/48 (2010.01)
H01L 33/52 (2010.01)
(Continued)

(52) U.S. Cl.
CPC ............ *H01L 33/483* (2013.01); *H01L 33/52* (2013.01); *H01L 33/62* (2013.01); *H01S 5/022* (2013.01);
(Continued)

(58) Field of Classification Search
CPC ....... H01L 33/483; H01L 33/52; H01L 33/62; H01L 33/507; H01L 33/486; H01S 5/022;
(Continued)

(56) References Cited

U.S. PATENT DOCUMENTS 4,873,566 A 10/1989 Hokanson et al.
2012/0045183 A1* 2/2012 Fujimura ................. G02B 6/42
385/93
(Continued)

FOREIGN PATENT DOCUMENTS

CN 204375790 U 6/2015
CN 105845808 A 8/2016
(Continued)

OTHER PUBLICATIONS

English Translation of International Preliminary Report on Patentability Chapter 1 (Year: 2020).*
(Continued)

*Primary Examiner* — Rajarshi Chakraborty
*Assistant Examiner* — Glenn D Zimmerman
(74) *Attorney, Agent, or Firm* — MH2 Technology Law Group LLP

(57) ABSTRACT

In one embodiment, the optoelectronic semiconductor component (1) comprises a semiconductor chip (2) for generating radiation and an inorganic housing (3). The semiconductor chip (2) is accommodated in a hermetically sealed manner in the housing (3). The housing (3) has a preferably ceramic base plate (31), a cover plate (33) and at least one preferably ceramic housing ring (32) and a plurality of
(Continued)

Figure 1A:
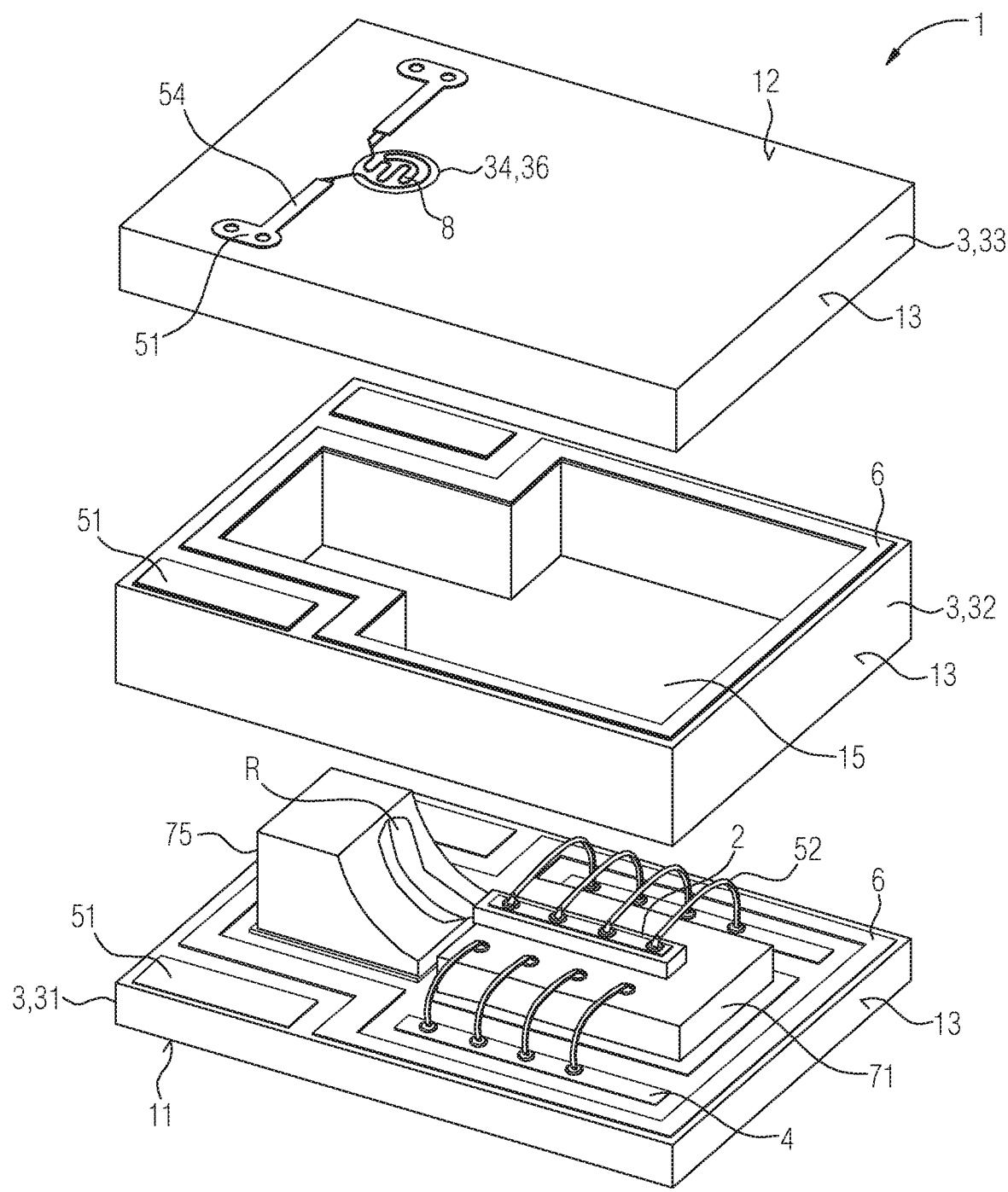

electrical through-connections (51). A recess (15), in which the semiconductor chip (2) is located, is formed by the housing ring (32). The base plate (31) has a plurality of electrical connection surfaces (35) on a component underside (11). A plurality of through-connections (51) each extend through the base plate (31), through the cover plate (33) and through the housing ring (32). The base plate (31), the at least one housing ring (32) and the cover plate (33) are firmly connected to one another via continuous, peripheral inorganic sealing frames (6). Finally, the housing (3) comprises a radiation exit region (34) for emitting radiation.

16 Claims, 9 Drawing Sheets

(51) Int. Cl.
    *H01L 33/62* (2010.01)
    *H01S 5/02208* (2021.01)
    *H01S 5/0237* (2021.01)
    *H01S 5/02326* (2021.01)
    *H01S 5/022* (2021.01)
    *H01S 5/02315* (2021.01)

(52) U.S. Cl.
    CPC ........ *H01S 5/0237* (2021.01); *H01S 5/02208* (2013.01); *H01S 5/02315* (2021.01); *H01S 5/02326* (2021.01)

(58) Field of Classification Search
    CPC ............. H01S 5/02208; H01S 5/02315; H01S 5/02326; H01S 5/0237; H01S 5/02255; H01S 5/02257; H01S 5/02345
    See application file for complete search history.

(56) References Cited

U.S. PATENT DOCUMENTS

| | | | |
|---|---|---|---|
| 2013/0272329 A1* | 10/2013 | Auen | .............. H01S 5/024 372/34 |
| 2016/0149088 A1 | 5/2016 | Yan et al. | |
| 2017/0170627 A1 | 6/2017 | Furuya | |

FOREIGN PATENT DOCUMENTS

| | | |
|---|---|---|
| DE | 10125374 C1 | 1/2003 |
| DE | 102009005709 A1 | 7/2010 |
| DE | 102015208704 A1 | 11/2016 |
| EP | 2525419 A2 | 11/2012 |
| JP | H5175614 | 7/1993 |
| JP | H10242442 | 9/1998 |
| JP | H11273138 | 10/1999 |
| JP | 2003100921 A | 4/2003 |
| JP | 2003347529 A | 12/2003 |
| JP | 200538956 A | 2/2005 |
| JP | 2006128514 A | 5/2006 |
| JP | 200727716 A | 2/2007 |
| JP | 2007294834 A | 11/2007 |
| JP | 200820620 A | 1/2008 |
| JP | 2009117760 A | 5/2009 |
| JP | 2009283902 A | 12/2009 |
| JP | 2009289835 A | 12/2009 |
| JP | 2010232396 A | 10/2010 |
| JP | 201166093 A | 3/2011 |
| JP | 2012195474 A | 10/2012 |
| JP | 2013115149 A | 6/2013 |
| JP | 201560159 A | 3/2015 |
| JP | 2015170701 A | 9/2015 |
| JP | 20169693 A | 1/2016 |
| JP | 201692288 A | 5/2016 |
| JP | 2016122715 A | 7/2016 |
| JP | 201785036 A | 5/2017 |
| KR | 20120040973 A | 4/2012 |
| WO | 2016180851 A1 | 11/2016 |
| WO | 2017012763 A1 | 1/2017 |

OTHER PUBLICATIONS

Korean Notice of Allowance (with English Translation) in corresponding Korean Application No. 10-2020-7013233 dated Oct. 28, 2021, 6 pages.

Japanese Office Action (with English Translation) dated Jun. 1, 2021 for corresponding Japanese Application No. 2020-516668, 7 pages.

International Search Report and Written Opinion in corresponding International Application No. PCT/EP2018/077318 dated Nov. 29, 2018, 14 pages.

* cited by examiner

OPTOELECTRONIC SEMICONDUCTOR COMPONENT, AND METHOD FOR PRODUCING AN OPTOELECTRONIC SEMICONDUCTOR COMPONENT

CROSS-REFERENCE TO RELATED APPLICATION(S)

This application is a national stage entry from International Application No. PCT/EP2018/077318, filed on Oct. 8, 2018, published as International Publication No. WO 2019/072761 A1 on Apr. 18, 2019, and claims priority under 35 U.S.C. § 119 from German Patent Application No. 102017123413.6, filed on Oct. 9, 2017, the entire contents of all of which are incorporated herein by reference.

An optoelectronic semiconductor component is provided. Further, a production method for an optoelectronic semiconductor component is provided.

Document DE 10 2015 208 704 A1 describes an optoelectronic semiconductor component with a ceramic housing.

Document DE 10 2009 005 709 A1 discloses an optoelectronic semiconductor component which comprises a housing having a ceramic.

An object is to provide an optoelectronic semiconductor component having a hermetically sealed housing that can be produced efficiently.

This object is achieved, inter alia, by an optoelectronic semiconductor component and by a production method having the features of the independent patent claims. Preferred developments are the subject matter of the dependent claims.

According to at least one embodiment, the semiconductor component comprises one or more semiconductor chips. The at least one semiconductor chip is provided for generating radiation. The semiconductor chip is preferably a laser diode, alternatively the semiconductor chip can be a light-emitting diode. In particular, the semiconductor chip is designed to generate near-ultraviolet radiation, visible light or near-infrared radiation. The semiconductor chip preferably generates blue light.

According to at least one embodiment, the semiconductor component comprises a housing. The housing is made of inorganic materials. That is, the housing does not have a continuous connecting line from inside to outside the housing, which is formed from organic materials such as plastics, in particular epoxides or materials based on epoxides.

According to at least one embodiment, the housing is hermetically sealed and the semiconductor chip is accommodated in the housing in a hermetically encapsulated manner. That is, there is no significant exchange of substances such as oxygen or water vapor between an interior and an exterior of the housing. For example, hermetically sealed means that a leak rate is at most $5 \times 10^{-9}$ Pa m/s, in particular at room temperature.

According to at least one embodiment, the housing comprises a base plate. A component underside of the semiconductor component is formed by the base plate. The underside of the component is preferably a mounting side of the semiconductor component, by means of which the semiconductor component can be attached to an external carrier, for example, via surface mounting. Correspondingly, the base plate preferably comprises a plurality of electrical connection surfaces which are located on the underside of the component and via which the semiconductor component can be mechanically and/or electrically connected, for example, by soldering or electrically conductive bonding.

According to at least one embodiment, the base plate is a ceramic plate. That is, the base plate preferably consists of one or more ceramics such as aluminum nitride, aluminum oxide or silicon carbide. Alternatively, the base plate can also be made of a glass or a semiconductor material such as silicon or germanium.

According to at least one embodiment, the housing comprises a cover plate. A component upper side of the semiconductor component, which lies opposite the component underside, is formed by the cover plate. The cover plate preferably has at least one ceramic material, but can also have or consist of one or more glasses or a semiconductor material.

According to at least one embodiment, the housing comprises one or more housing rings. The at least one housing ring is preferably made of at least one ceramic material, analogous to the base plate. Alternatively, the housing ring can also be made of a glass or a semiconductor material such as silicon or germanium.

According to at least one embodiment, the housing ring is located between the base plate and the cover plate. That is, the base plate and the cover plate are arranged at a distance from one another due to the at least one housing ring and are connected to one another via the housing ring.

According to at least one embodiment, the base plate and the at least one housing ring are made of the same material. Optionally, the cover plate is also made of the same material, but preferably the material of the cover plate is different from the material of the base plate and of the at least one housing ring.

According to at least one embodiment, the housing has a plurality of electrical through-connections, also referred to as vias or plated through-holes or through-contacts. The through-connections are located in the base plate and in the cover plate as well as in the at least one housing ring. It is not absolutely necessary for the through-connections to run continuously and/or in a straight line from the underside of the component to the upper side of the component. In other words, steps can be formed in the through-connections and/or the through-connections run only in sections from the underside of the component to the upper side of the component. Preferably, at least one continuous electrical connection is provided from the component underside to the component upper side, which is implemented by at least one of the electrical through-connections. The through-connections extend at least partially transversely, in particular perpendicularly to the underside of the component.

According to at least one embodiment, a recess is formed by the at least one housing ring. The recess is preferably completely or substantially completely surrounded by the housing ring in a lateral direction. A bottom surface and an upper side of the recess are preferably formed by the base plate and the cover plate, respectively. The at least one semiconductor chip is mounted in the recess. Electrical contact, in particular of the semiconductor chip, is made out of the recess by means of the through-connections.

According to at least one embodiment, the through-connections or at least some of the through-connections run partially or completely distant from the recess. This means that, as intended, these through-connections are not accessible from inside the recess. In particular, within the recess the relevant through-connection is not electrically connected to an electrical component of the semiconductor component such as the semiconductor chip. The respective, preferably two or more than two through-connections can be electrically insulated from the recess.

According to at least one embodiment, the base plate, the at least one housing ring and the cover plate are firmly connected to each other by means of sealing frames. The sealing frames are made of inorganic materials, such as metals or glasses. The sealing frames are, in particular, continuous, circumferential frames which, seen in plan view, extend in one or more continuous webs around an inner region of the corresponding base plate, cover plate and/or housing ring. In particular, the sealing frames are the only components which mechanically connect the base plate, the cover plate and the at least one housing ring to one another. The sealing frames are hermetically sealing connecting elements between the base plate, the cover plate and the at least one housing ring.

According to at least one embodiment, the housing comprises one or more radiation exit regions. The radiation exit region is preferably located in the cover plate, but alternatively can also be located in the base plate or in the housing ring. Furthermore, it is possible for the radiation exit region to extend over a plurality of housing components, for example, via the cover plate and one of the housing rings.

In at least one embodiment, the optoelectronic semiconductor component comprises at least one semiconductor chip for generating radiation and an inorganic housing. The semiconductor chip is accommodated in the housing in a hermetically sealed manner. The housing has a ceramic base plate, a cover plate and at least one ceramic housing ring between the base plate and the cover plate, and a plurality of electrical through-connections. A recess in which the semiconductor chip is located is formed by the housing ring. The base plate has a plurality of electrical connection surfaces on a component underside for external electrical contacting of the semiconductor component. A plurality of the through-connections extend through the base plate, through the cover plate and through the housing ring in the direction transverse to the component underside. These through-connections or at least some of these through-connections preferably run at a distance from the recess. The base plate, the at least one housing ring and the cover plate are firmly connected to one another via continuous, surrounding inorganic sealing frames. Finally, the housing comprises a radiation exit region for emitting radiation.

Optoelectronic semiconductor components for radiation emission are increasingly used under environmental conditions, for example, in the automotive field, which require a tight encapsulation of semiconductor chips for protection from environmental influences. Since increasingly larger numbers of such semiconductor components are installed, for example, in mobile telephones, corresponding housings are to be able to be produced in a mass-production and cost-effective manner.

A hermetic enclosure of a semiconductor chip can be achieved with the semiconductor component described herein. In this case, the respective housing is formed from inorganic materials. Furthermore, the housing permits a three-dimensional guidance of conductor tracks, in particular by means of the through-connections.

Different electrical components can be integrated in the housing, for example, semiconductor lasers, light-emitting diodes, sensors, integrated circuits, ICs for short, user-specific integrated circuits, ASICs for short, optical elements such as optical filters and/or light-converting elements such as phosphors. Furthermore, the housings described here can be processed in parallel in a panel process and/or in a wafer process, such that a more cost-effective production is made possible.

Furthermore, miniaturization by means of integration possibilities of electrical components is possible by means of the housing described herein. In addition to the already mentioned laser diodes, light-emitting diodes, ICs or ASICs, passive electrical components such as resistors, capacitors, inductors or devices for protection against electrostatic discharges can also be accommodated in the housing, in particular in the recess, and alternatively or additionally optical elements such as windows, filters, mirrors, prisms and/or lenses.

According to at least one embodiment, the semiconductor component comprises a plurality of the housing rings. The housing rings are preferably stacked one above the other and, by means of this stack of the housing rings, the base plate and the cover plate are spaced apart from one another and are connected to one another via this stack.

According to at least one embodiment, the sealing rings are formed differently from each other in the area of the recess when viewed from above. This means that the recess has different shapes at the different sealing rings. Alternatively, it is possible that, seen in plan view, all the housing rings are of identical design and/or are stacked on top of one another in a congruent manner.

The base plate, the cover plate and the housing ring or rings can terminate flush with one another on side walls of the housing. That is, the base plate, the cover plate and the housing ring or rings preferably do not project beyond one another in the direction away from the recess. Overall smooth side walls are thus possible.

According to at least one embodiment, the sealing frames are metallic sealing frames. That is, the sealing frames consist of one or, preferably, of a plurality of metals. In particular, the sealing frames are solder connections, for example, from the material systems Au/Sn, Au/Ge, Ni/Sn and/or Cu/Sn. Such solders are particularly suitable for diffusion soldering. Material systems for the sealing frames such as Bi/Sn/Ag, In/Sn and/or Zn/Sn/In are also possible as low-temperature systems.

According to at least one embodiment, the inorganic sealing frames are free or substantially free of metals. For this purpose, the sealing frames are made, for example, of a glass, of silicon dioxide or of a semiconductor such as silicon or germanium. Anodic bonding is then used, for example, as joining technique.

According to at least one embodiment, one of the housing rings is a mounting platform for the semiconductor chip. That is, the semiconductor chip is mounted on this housing ring.

Alternatively, the semiconductor chip can be mounted on a plurality of the housing rings. If a plurality of semiconductor chips are present, these can be attached to one of the housing rings or the semiconductor chips are mounted on different housing rings.

According to at least one embodiment, at least one electrical contact surface is located on the housing ring or on one of the housing rings or on a plurality of the housing rings or on all of the housing rings in the recess. The electrical contact surface is provided, for example, for the semiconductor chip or for ICs and for electrical connecting lines such as bonding wires. The at least one contact surface can be a lateral continuation of at least one associated through-connection.

It is possible for the electrical contact surfaces to be oriented parallel to the component underside, for example, with a tolerance of at most 20° or 10° or 5°. Alternatively, this contact surface or some of these contact surfaces can be oriented transversely to the component underside, for example, with a tolerance of at most 20° or 10° or 5° perpendicular to the component underside.

According to at least one embodiment, a plurality of electrical contact surfaces are located in the recess on the base plate and/or on the cover plate. Some or all of these contact surfaces are directly or indirectly electrically connected to the semiconductor chip. An indirect electrical connection means, for example, that in particular an IC and/or a driver is located between the relevant contact surface and the semiconductor chip.

According to at least one embodiment, one or more of the following components are located in the recess: a driver for the semiconductor chip, an integrated circuit, a monitor diode for the radiation to be generated, a control circuit for power regulation or power adjustment of the semiconductor chip, a control unit for the radiation exit region. Preferably, a plurality of these components are present in combination in the recess. In particular, it is possible for all electronic components of the semiconductor component to be hermetically encapsulated within the housing in the recess.

According to at least one embodiment, the radiation exit region, seen in plan view, occupies at most 20% or 10% or 5% of a base surface of the cover plate. In other words, the radiation exit region is then restricted to a small region of the cover plate. In particular, in this case, the radiation exit region is surrounded all around by a material of the cover plate which is impermeable to the radiation to be produced, as seen in plan view.

Alternatively, it is possible for the entire cover plate or for a large part of the cover plate to be permeable to the radiation to be generated. In this case, the radiation exit region can extend over a large part or over the entire or substantially over the entire cover plate.

According to at least one embodiment, the cover plate comprises one or more ceramic materials. For example, one part of the cover plate is made of aluminum nitride and another part of the cover plate is made of aluminum oxide. One or more luminescent materials may be located, for example, in the aluminum oxide region.

According to at least one embodiment, the radiation exit region, which in particular is a component of the cover plate, comprises one or more luminescent materials. The radiation generated by the semiconductor chip during operation is partially or completely converted into another radiation having a preferably greater wavelength by means of the at least one luminescent material.

In particular, one or more of the following luminescent materials are used: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd, Lu, Tb, Y)_3(Al,Ga,D)_5(O,X)_{12}:RE$ where X=halide, N or divalent element, D=trivalent or tetravalent element and RE=rare earth metals, such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs, for example, from the system $Li_xM_yLn_zSi_{12-(m+n)}Al_{(m+n)}O_nN_{16-n}$; beta-SiAlONs from the system $Si_{6-x}Al_xO_yN_{8-y}:RE_z$ where RE=rare earth metals; nitrido orthosilicates such as $AE_{2-x-a}RE_xEu_aSiO_{4-x}N_x$ or $AE_{2-x-a}RE_xEu_aSi_{1-y}O_{4-x-2y}N_x$ where RE=rare earth metal and AE=alkaline earth metal or such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM phosphors from the $BaO-MgO-Al_2O_3$ system such as $BaMgAl_{10}O_{17}:Eu^{2+}$; halophosphates such as $M_5(PO_4)_3(Cl,F):(Eu^{2+},Sb^{2+},Mn^{2+})$; SCAP phosphors such as $(Sr,Ba,Ca)_5(PO_4)_3Cl:Eu^{2+}$. In addition, so-called quantum dots can also be introduced as luminescent material. Quantum dots in the form of nanocrystalline materials which contain a group II-VI compound and/or a group III-V compounds and/or a group IV-VI compound and/or metal nanocrystals are preferred.

According to at least one embodiment, a testing device is attached to the radiation exit region, for example, on a side of the radiation exit region facing away from the at least one housing ring or alternatively in the recess. The testing device is designed to determine whether the radiation exit region is intact. The testing device operates in particular electrically, for example, via the electrical resistance thereof or also inductively or capacitively.

According to at least one embodiment, the testing device is formed by a resistance element, such as an electrical conductor track, which is permeable to the radiation generated during operation. Alternatively, the testing device can be formed by at least one coil and/or at least one capacitor. For example, viewed from above, the testing device is completely or partially meander-shaped, spiral-shaped, areal-segment-shaped, antenna-shaped, round or angular corrugated and/or sinusoidal.

The radiation exit region is preferably mounted in the cover plate or on the cover plate. The testing device is formed, for example, by a plurality of loops made of a transparent conductive oxide, which snake over the radiation exit region.

According to at least one embodiment, the testing device, in particular if formed as a conductor track, is electrically connected to one or more of the electrical connection surfaces on the component underside via one or more of the through-connections. As a result, it is possible that, via these electrical connection surfaces, it is determined from outside the semiconductor component whether the radiation exit region and/or the testing device are intact.

Alternatively, it is possible for the testing device to be electrically connected to the control unit in the interior of the recess via the through-connections. In the latter case, it is possible that the semiconductor component can only be configured for radiation emission as long as the testing device and thus the radiation exit region are intact.

According to at least one embodiment, a deflection optics for the radiation generated by the semiconductor chip is located in the recess. The deflection optics can be a mirror. The mirror can be planar or can be configured as a light-collecting mirror for collimation or focusing of the radiation generated by the semiconductor chip. The deflecting optics is preferably fastened to the base plate, alternatively the deflecting optics can also be attached to one or more of the housing rings or to the cover plate.

According to at least one embodiment, the semiconductor chip emits, during operation as intended, the radiation, in particular laser radiation, parallel to the base plate, for example, with a tolerance of at most 30° or 15° or 5°. This angle preferably applies to an optical axis and/or to a direction of maximum intensity of the radiation generated. Alternatively, the radiation from the semiconductor chip is emitted transversely, for example, perpendicularly or approximately perpendicularly to the base plate.

According to at least one embodiment, the radiation generated by the semiconductor chip during operation is deflected by the deflection plate in the direction perpendicular to the base plate, for example, with a tolerance of at most 30° or 15° or 5° with respect to the optical axis of the radiation and/or on the direction of the maximum intensity thereof.

According to at least one embodiment, the base plate and/or the cover plate are formed by continuous, plane-parallel plates. Alternatively, the plate in which the radiation exit region is located, in particular the cover plate, can also run in a curved manner and, for example, can be located closer to the base plate in a central region than in an edge region in which the at least one housing ring lies.

According to at least one embodiment, the housing ring or the housing rings have a constant thickness around the recess, in particular in the direction perpendicular to the component underside. This means that the individual housing rings run round the recess with a constant height in relation to the underside of the component.

According to at least one embodiment, the side surfaces of the housing are free of electrically conductive materials. In particular, no through-connections are located on the lateral surfaces. This makes it possible to avoid potential short circuits between adjacent semiconductor components which can be arranged closely adjacent to one another on a printed circuit board.

According to at least one embodiment, the housing is cuboid or cube-shaped. Alternatively, the housing can be formed as a prism, for example, as a triangular prism or as an especially regular hexagonal prism. In this case, bottom surfaces and top sides of corresponding prisms are preferably formed by the base plate and by the cover plate.

According to at least one embodiment, the base plate, the cover plate and/or the at least one housing ring have a thickness of at least 0.1 mm or 0.25 mm. Alternatively or additionally, these thicknesses are at most 1.5 mm or 0.8 mm. Alternatively or additionally, the housing has edge lengths, in particular seen in plan view, which are at least 1 mm or 1.5 mm or 3 mm and/or at most 8 mm or 5 mm or 4 mm.

According to at least one embodiment, the base plate, cover plate and/or the at least one housing ring are made of a material having a specific thermal conductivity of at least 20 W/m·K or 70 W/m·K or 150 W/m·K or 170 W/m·K or 220 W/m·K or 400 W/m·K. Such relatively high specific heat conductivities can be achieved in particular by ceramics. It is possible for the base plate to be made of a material having a higher specific thermal conductivity than the cover plate and/or the at least one housing ring.

According to at least one embodiment, thermal expansion coefficients of the base plate, of the cover plate and/or of the at least one housing ring differ from one another by at most $1 \times 10^{-5}$ 1/K or $5 \times 10^{-6}$ 1/K. In this way, excessive thermal stresses can be prevented when the base plate, the cover plate and the at least one housing ring are joined together. For example, in a combination of AlN with aluminum oxide for the components of the housing, this difference is about $4 \times 10^{-6}$ 1/K, and in a combination of aluminum oxide and quartz or glass this difference is about $7 \times 10^{-6}$ 1/K.

According to at least one embodiment, when the housing parts are joined together, the sealing frames have a processing temperature which is lower by at least 20° C. or 40° C. or 60° C. than finished electrical connecting means with which the semiconductor chip and/or optional further electrical components are fastened in the recess. This means that the sealing frames can be formed by low-melting solder or, in the completely processed state, high-melting material systems, whereas the electrical connecting means is preferably formed by a high-melting solder or by a completely processed material system having a higher melting point. This makes it possible to prevent the electrical components, such as the semiconductor chip or bonding wires, from becoming detached when the sealing frames are joined together.

According to at least one embodiment, the semiconductor component can be fastened by means of surface mount technology mounting, SMT for short, for example. This means that the semiconductor component is stable at a temperature of 220° C. or 260° C. for at least 30 s or 60 s, so that the sealing frames and the electrical connecting means are not damaged during the SMT process.

Moreover, a production method for such an optoelectronic semiconductor component, as described in connection with one or more of the above-mentioned embodiments, is provided. Features of the production method are therefore also disclosed for the semiconductor component and vice versa.

In at least one embodiment, the manufacturing process comprises the following steps, preferably in the order given:

A) providing the base plate, the at least one housing ring and the cover plate one above the other, wherein the base plate is provided on a side facing the cover plate and the cover plate is provided on a side facing the base plate and the at least one housing ring is provided on both sides with the sealing frames or with components for the sealing frames, and B) connecting the base plate, the at least one housing ring and the cover plate to one another in a fixed manner by simultaneously connecting all adjacent sealing frames to one another.

Simultaneous connection means that the connection takes place in a single working step. That is, it is not necessary for the various sealing frames to be processed and/or melted exactly at the same time, but slight time delays can occur within the same working step, for example, due to delays in the heating of the components of the housing, in particular due to the finite heat conductivity of the housing materials.

It is possible for the sealing frames to be formed in their final material composition only by connecting. If the finished sealing frame is made, for example, of AuSn, it is possible for the previously attached sealing frames of the components to be joined to be formed from a gold layer on the one hand and from a tin layer on the other hand. The desired alloy or mixture for the sealing frame is then formed only by mixing the metals involved in heating in the course of connecting. For this purpose, it is possible for one or both of the sealing frames to be joined together to be composed of multilayer systems, for example, of alternately successive gold layers and tin layers, or of copper layers and tin layers.

According to at least one embodiment, steps A) and B) are carried out in the wafer composite or in the panel composite. That is, a large number of housings are created in parallel. For this purpose, the base plate, the cover plate and/or the housing rings preferably extend continuously over a plurality of the later, finished optoelectronic semiconductor components during steps A) and B).

According to at least one embodiment, the method comprises a step C) in which a separation to the semiconductor components takes place. Step C) preferably follows steps A) and B). Step C) can be a sawing and/or a breaking, for example, along predetermined breaking lines. Separation by cutting, such as laser cutting, is also possible.

An optoelectronic semiconductor component described here and a production method described here are explained in more detail with reference to the drawing on the basis of exemplary embodiments. Identical reference symbols indicate identical elements in the individual figures. However, no relationships true to scale are shown here. Rather, individual elements may be illustrated in an exaggerated manner for better understanding.

Figure 1B:
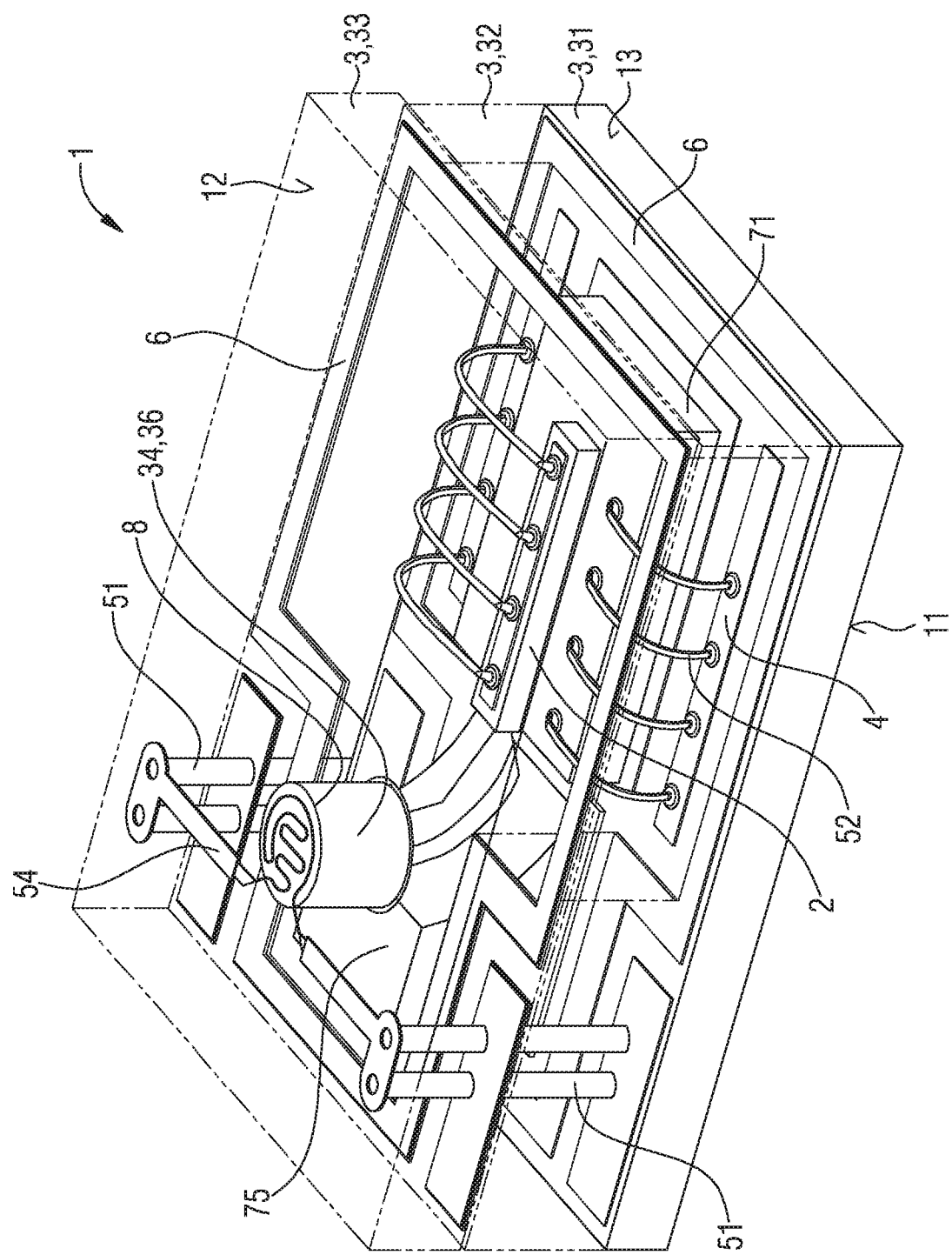
Figure 1C:
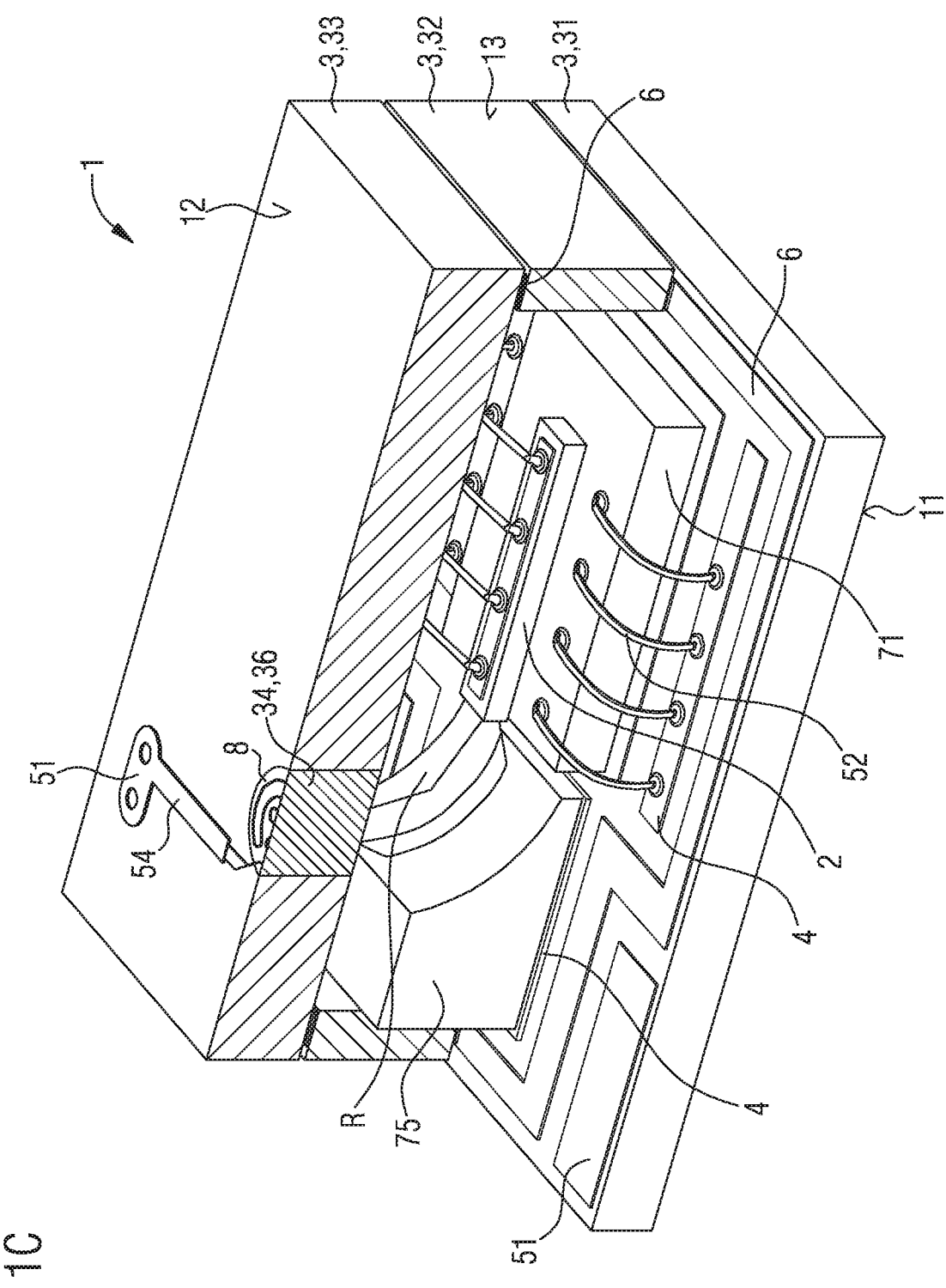
Figure 1D:
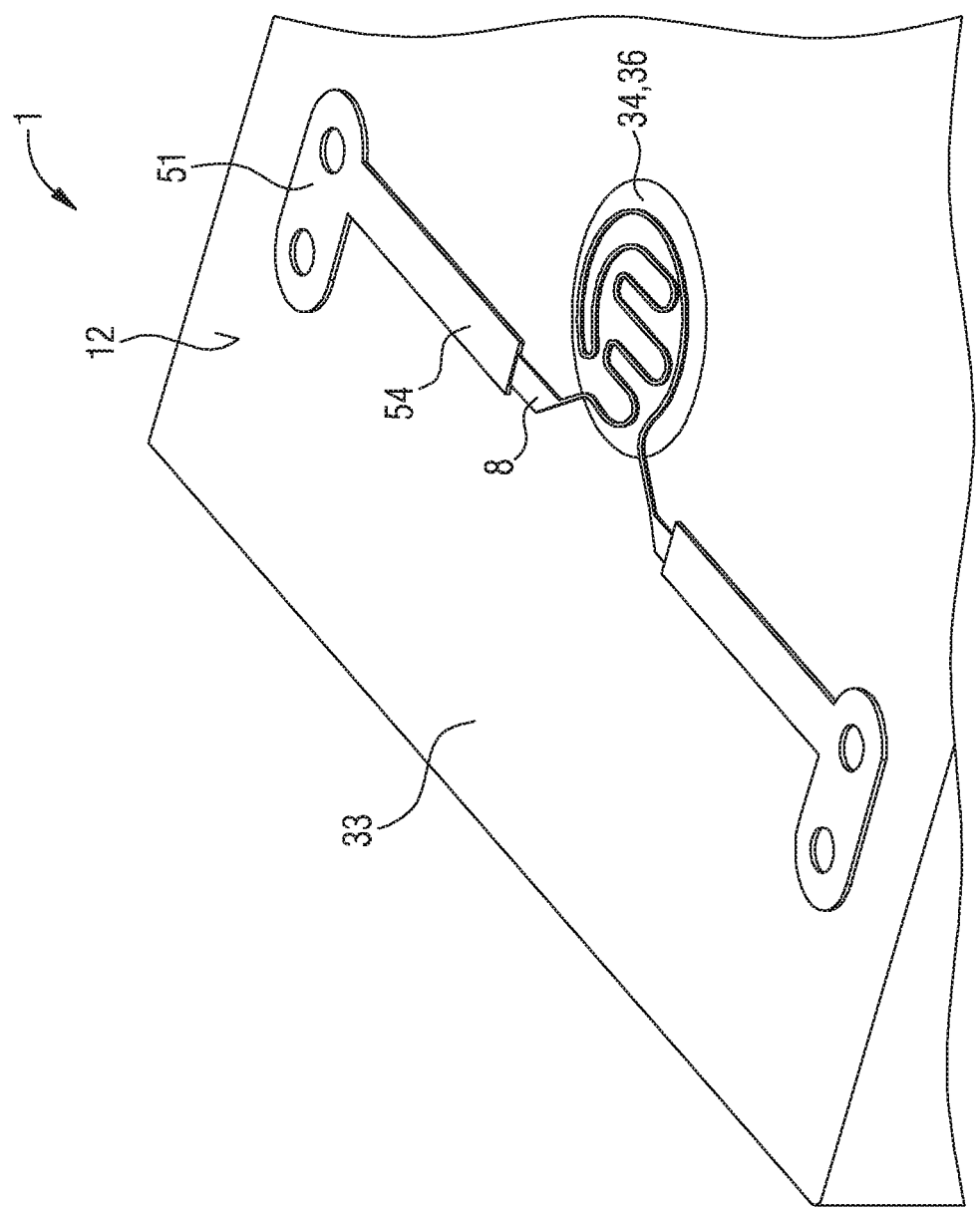
Figure 2:
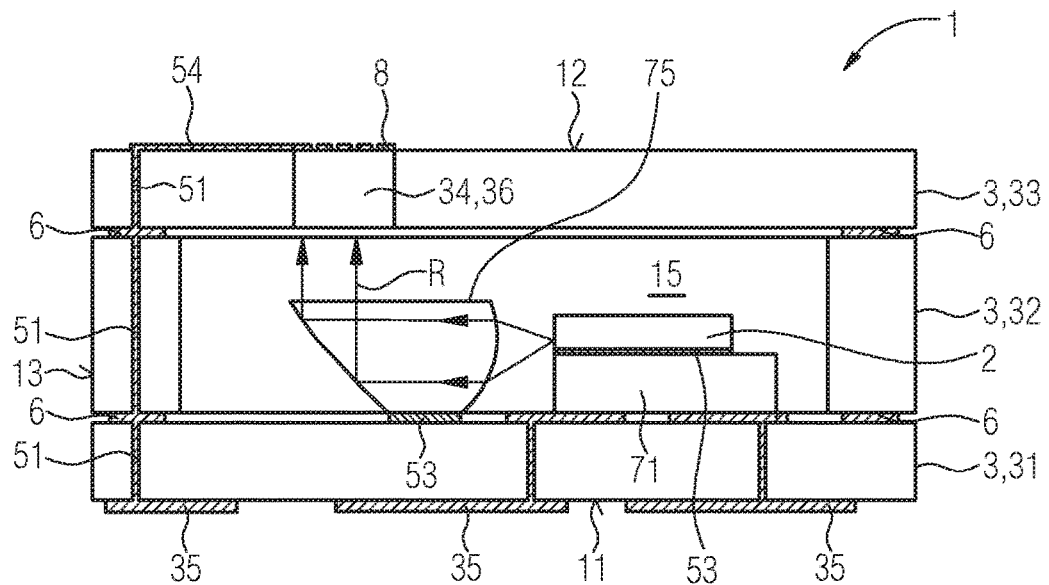
Figure 3:
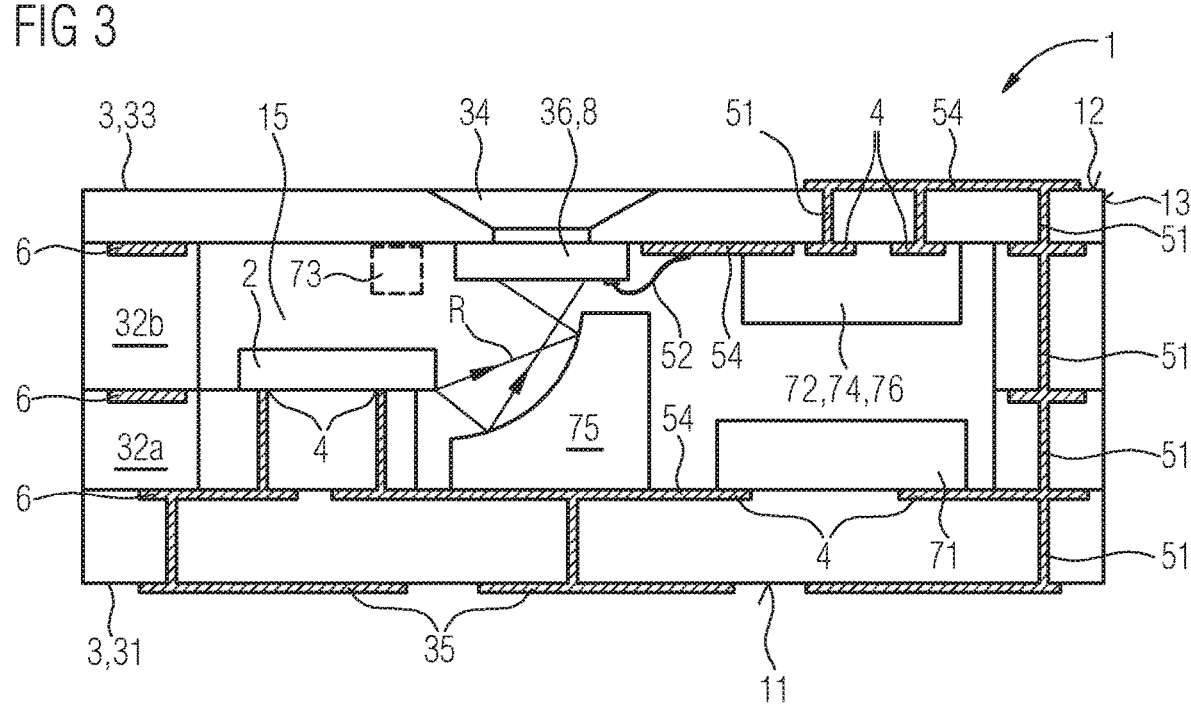
Figure 4:
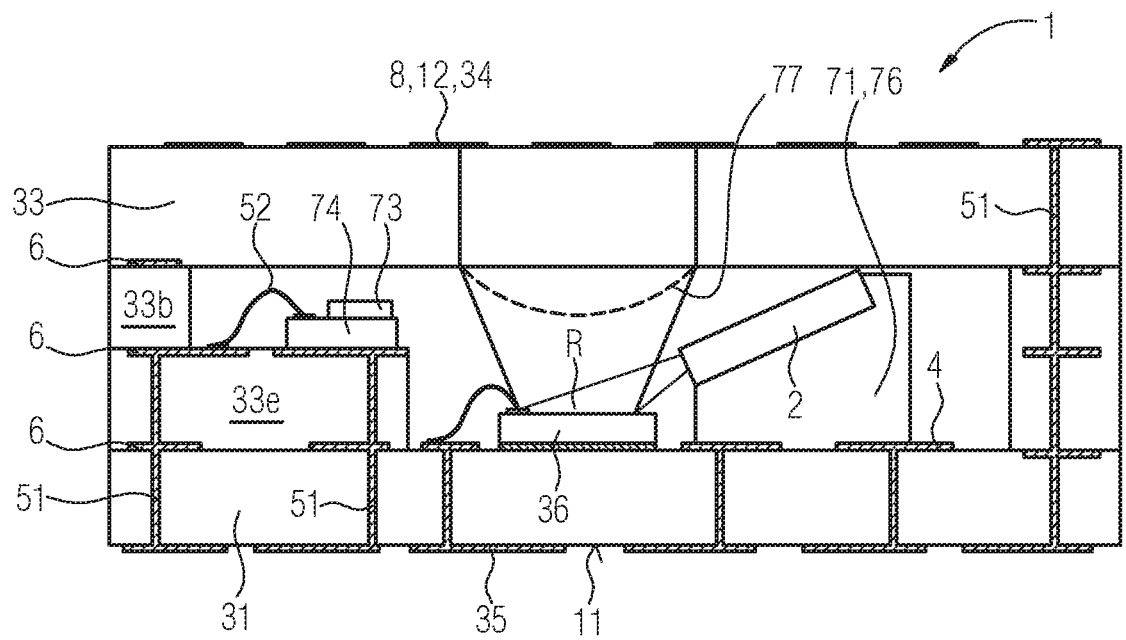
Figure 7:
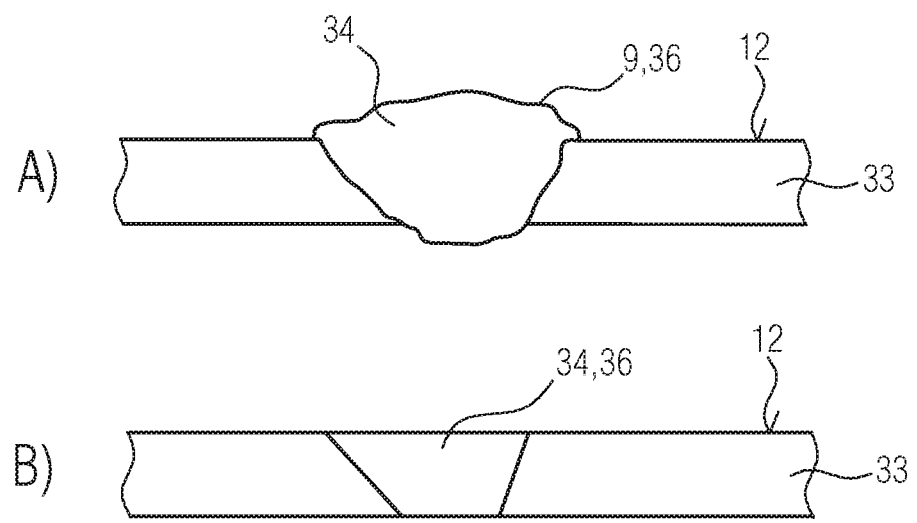
Figure 8:
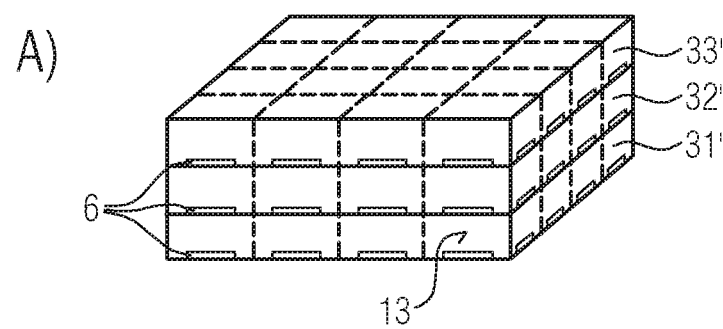
Figure 8:
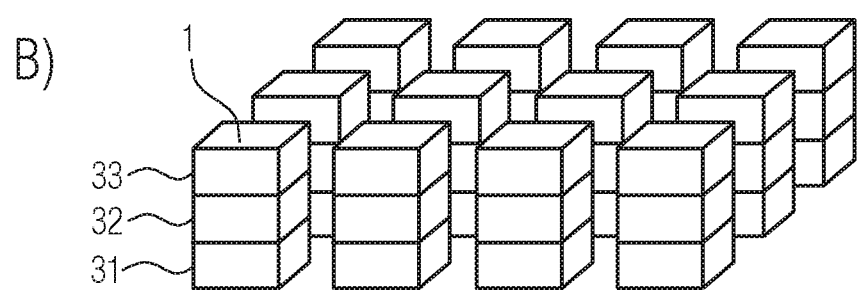
Figure 9:
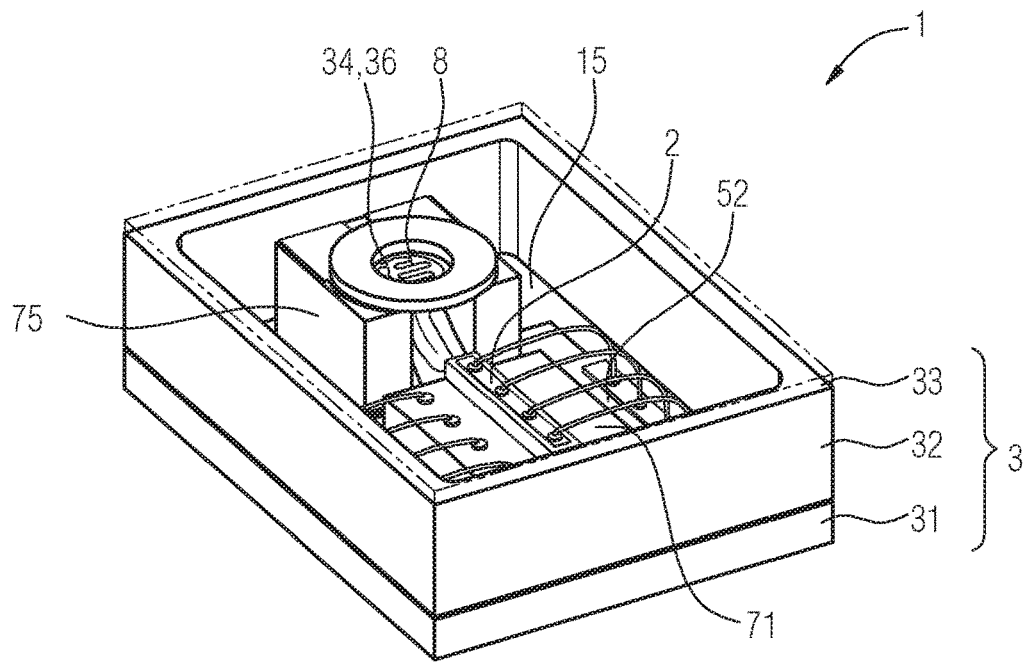
Figure 10:
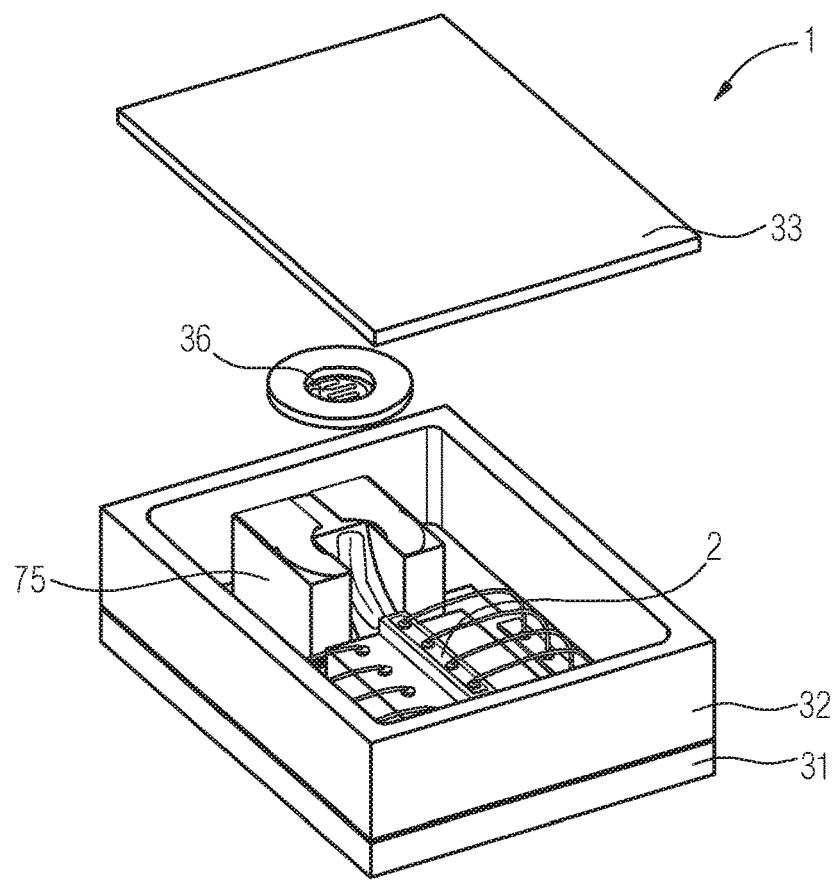

In the figures:

FIG. 1 shows a schematic perspective view of an exemplary embodiment of an optoelectronic semiconductor component described herein, FIGS. 2 to 4 show schematic sectional views of exemplary embodiments of optoelectronic semiconductor components described herein, FIGS. 5 to 8 show schematic illustrations of method steps for the production of optoelectronic semiconductor components described here, and FIGS. 9 and 10 show schematic perspective sectional views of exemplary embodiments of optoelectronic semiconductor components described herein.

FIG. 1 shows a perspective view of an exemplary embodiment of an optoelectronic semiconductor component 1, see the exploded drawing in FIG. 1A, the partially transparent schematic drawing in FIG. 1B, the sectional illustration in FIG. 1C and the detailed view in FIG. 1D.

The semiconductor component 1 comprises a housing 3 which is composed of a base plate 31, a housing ring 32 and a cover plate 33. These three components 31, 32, 33 lie congruently on top of one another. Furthermore, these three components 31, 32, 33 are mechanically and hermetically connected to one another by means of preferably metallic sealing frames 6.

The base plate 31 and the cover plate 33 are plane-parallel plates. A recess 15 is defined by the housing ring 32 which has a constant height all around the recess 15. A driver 71 for a semiconductor chip 2 is located in the recess 15 on electrical connection surfaces 4. The semiconductor chip 2 is a laser diode which is designed to generate a radiation R. The radiation R is preferably blue light. The semiconductor chip 2 is mounted on the driver 71 so that the driver 71 constitutes a so-called submount for the semiconductor chip 2. The semiconductor chip 2 and the driver 71 are electrically connected via a plurality of bonding wires 52.

Alternatively to a driver 71, a submount can also be used as a spacer and/or as a heat sink between the base plate 31 and the at least one semiconductor chip 2. Such a submount is made, for example, of AlN, SiC or silicon nitride and preferably has metallizations for the semiconductor chip 2 and optionally for bonding wires 52. In addition, the driver 71 or the submount may have electrical vias, which extend in particular from the bottom plate to a side facing the semiconductor chip. If such vias are present, it is possible for bonding wires to be omitted. The same also applies to all other exemplary embodiments, wherein in the following reference is always made to the driver only in a simplified manner.

Deflecting optics 75 are optically arranged downstream of the semiconductor chip 2. By means of the deflection optics 75, the radiation R is directed towards a component upper side 12 in the direction perpendicular to a component underside 11. In order to couple out the radiation, a radiation exit region 34 is located in the cover plate 33, which can be circular seen in plan view. The deflection optics 75, the driver 71 and the semiconductor chip 2 are soldered to one another and to the connection surfaces 4, preferably with a comparatively high-melting solder.

In addition, a plurality of electrical through-connections 51 is present, the through-connections 51 extend from the component underside 11 to the component upper side 12. In this case, two of the through-connections 51 lie outside the recess 15 at an edge of the housing 3. The remaining through-connections for direct electrical connection of the semiconductor chip 2 extend from the component underside 11 into the recess 15.

When the housing components 31, 32, 33 are joined together, the metallic sealing frames 6 have a lower processing temperature than finished electrical connecting means for fastening the bonding wires 52 and the semiconductor chip 2 and the driver 71. Thus, the electrical connections remain intact when the components 31, 32, 33 of the housing 3 are joined together. The sealing frames 6 are produced, for example, from a silver-based sintering paste, for example, at a temperature of approximately 190° C., the finished sealing frames 6 are then essentially made of silver and temperature-stable up to 960° C. Alternatively, the sealing frames 6 are produced from a layer composite of Au and Sn or of Cu and Sn, wherein the layers react at relatively low temperatures and the finished sealing frames 6 are comparatively temperature-stable.

The through-connections 51 can have a different shape within the components 31, 32, 33 than on the main sides of these components 31, 32, 33, see in particular FIG. 1B. For example, within the components 31, 32, 33 the through-connections 51 are formed by cylindrical holes which are filled in an electrically conductive manner. On the other hand, the through-connections 51 are flat on the main surfaces of the components 31, 32, 33 in order to simplify the joining of the through-connections 51.

A lens (not shown) may be located on an outside of the radiation exit region 34, the lens is made, for example, from a glass, sapphire or else from a plastic such as an epoxy, a silicone or a silicone-epoxy hybrid material.

According to FIG. 1, in each case the sealing frames 6 are not electrically connected and are thus not at any defined electrical potential, are in particular electrically neutral. This is not absolutely necessary. Thus, it is also possible for the sealing frames 6 to be brought to an electrical potential in a defined manner and, for example, to be electrically conductively connected to one of the through-connections 51 or themselves form a part of the through-connections 51, in particular on the main sides of the components 31, 32, 33. The same applies to all other exemplary embodiments.

The base plate 31 is made, for example, of an AlN ceramic, as is the housing ring 32. The cover plate 33 is made, for example, of aluminum oxide. The light exit region 34 is preferably formed by a luminescent material such as YAG:Ce in glass, also referred to as phosphor in glass or PIG for short. This PIG can terminate flush with the main sides of the cover plate 6. The laser radiation generated by the semiconductor chip 2 is preferably converted only partially into light of a longer wavelength by means of the luminescent material 36 in the radiation exit region 34, so that the semiconductor component 1 can overall emit white mixed light.

A testing device 8 is optionally located on the upper side 12 of the component. The testing device 8 can be used to determine whether the radiation exit region 34 comprising the luminescent material 36 is undamaged at least on the upper side 12 of the component. For example, the semiconductor component 1 would fall into the laser protection class 4 without the intact luminescent material 36, but with the luminescent material 36 only into the laser protection class 2. Correspondingly, depending on the state of the radiation exit region 34, different safety measures are required. For example, the semiconductor component 1 may only be operated when the radiation exit region 34 is present as intended.

For this purpose, the testing device 8 according to FIG. 1D is formed from a meandering, wound conductor strip, for example, made of ITO, which is permeable to the radiation R to be produced. The windings of the testing device 8 extend substantially across all regions of the radiation exit region 34. If the resistance of the testing device 8 increases significantly or the conductor path of the testing device 8 is interrupted, this is an indication that the radiation exit region 34 is damaged. Accordingly, the operation of the semiconductor component 1 is restricted or the semiconductor component 1 is no longer operated.

The testing device 8 is connected to the through-connections 51 laterally next to the recess 15 via conductor tracks 54 on the component upper side 12. In this way, the testing device 8 is electrically connected to electrical contact surfaces 35 on the component underside 11 via the component upper side 12 and the through-connections 51.

Typical dimensions of the semiconductor component 1 are, for example, 3.5 mm×2.5 mm×1.6 mm. The dimensions mentioned apply, for example, with a tolerance of 50%. The semiconductor component 1 is used in particular as flash light, for example, in mobile image recording devices such as mobile phones. Alternatively, it is possible for the semiconductor component 1 to be used in particular in the automotive field. The same applies to all other exemplary embodiments.

The semiconductor component 1 described here thus comprises a housing 3, which is made of inorganic materials, which hermetically seals the semiconductor chip 2 and which has an integrated three-dimensional interconnection. Furthermore, a high radiation stability is achieved.

FIG. 1 shows that in each case only one sealing frame 6 is present between adjacent components 31, 32, 33. Alternatively, a plurality of sealing frames 6 may be present in the form of closed circumferential rings in order to ensure a high degree of safety during sealing, even if individual sealing frames 6 were faulty.

Housing side surfaces 13 are preferably formed exclusively by the materials of the components 31, 32, 33 and are thus free of electrically conductive materials. In particular, the through-connections 51 and the sealing frames 6 do not reach the housing side surfaces 13.

As in all other exemplary embodiments, it is possible, in contrast to the illustration in FIG. 1, for the radiation exit region 34 to be located together with the luminescent material 36 in the base plate 31, so that the radiation R can be emitted through a mounting platform (not shown), for example, a printed circuit board, for the semiconductor component 1.

The deflection optics 75 can alternatively be attached to the cover plate 33. Furthermore, in contrast to the illustrations, the radiation exit region 34 can also lie on the housing ring 32 in particular in conjunction with the omission of the deflection optics 75.

The components 31, 32, 33 preferably have similar coefficients of thermal expansion, so that, when these components 31, 32, 33 are joined together, only small different longitudinal expansions occur, which are to be compensated for in the design. Therefore, the same material is preferably selected for all components 31, 32, 33, for example, is selected from the group $Al_2O_3$, AlN, SiC, $SiO_2$, glass, silicon.

Furthermore, metallic panels with surface passivation are also conceivable, for example, in the form of nanoceramic, formed by an aluminum core with full-surface or partial $Al_2O_3$ passivation. That is, the components 31, 32, 33 may also be formed only partially by a ceramic. The same applies in all other exemplary embodiments.

In the exemplary embodiment of FIG. 2, it is illustrated that the deflecting optics 75 are formed at the same time as a converging lens close to the semiconductor chip 2 and as a mirror, for example, a totally reflecting mirror, on a side facing away from the semiconductor chip 2. The deflection optics 75 are preferably connected to the base plate 31 via a high-melting electrical connecting means 53, as is preferably also true for the semiconductor chip 2 and the driver 71.

The sealing frames 6 preferably lie on the main sides of the associated components 31, 32, 33, in particular in a flat manner, as can be the case with the extensions of the through-connections 51 on the main sides. Alternatively, the sealing frames 6 can also be partially or completely recessed in the associated components 31, 32, 33, so that a distance between the components 31, 32, 33 is then smaller than a thickness of the sealing frames 6, or adjacent components 31, 32, 33 touch, in particular in an areal manner. Mixed forms are possible between the sealing frames 6 lying on top of one another and sealing frames 6 that are at least partially sunk. The same applies to all other exemplary embodiments.

FIG. 3 shows that, in addition to the semiconductor chip 2 and the driver 71, further electrical components are located in the recess 15, such as an integrated circuit 72, a control circuit 74 and a control unit 76 for the radiation exit region 34. For this purpose, a plurality of the electrical connection surfaces 4 are present, which can be connected to one another via the conductor tracks 54, assisted by bonding wires 52. Optionally, a monitor diode 73 can be present, only schematically drawn as a dashed line in FIG. 3.

The semiconductor chip 2 is mounted on one of the housing rings 32a which is located close to the base plate 31. The further housing ring 32b on the cover plate 33 serves as a spacer and has a different shape at the recess 15 than the housing ring 32a.

The driver 71 is located on the base plate 31, the electronic components 72, 74, 76 are attached to the connecting surfaces 4 on the cover plate 33. For this purpose, one of the through-connections 51 can be guided up to the component upper side 12, coming from the component underside 11, can then run via the conductor track 54 on the component upper side 12, and can then run through the cover plate 33 back to these electronic components 72, 74, 76 via a further through-connection 51.

In the exemplary embodiment of FIG. 3, seen in cross section, the radiation exit region 34 is shaped like a symmetrical trapezium and widens in the direction away from the base plate 31. The luminescent material 36, in particular in the form of a phosphor ceramic, is located on an inner side of the cover plate 33. The same is possible in all other exemplary embodiments.

In the exemplary embodiment of FIG. 4, the monitor diode 73 is located together with the control circuit 74 on the housing ring 32a on the base plate 31. The semiconductor chip 2 emits the radiation R obliquely to the component underside 11. The luminescent material 36 is operated in reflection. The entire cover plate 33 is made of a material which is permeable to the radiation generated, so that the radiation exit region 34 extends substantially over the entire cover plate 33. Accordingly, the optional testing device 8 preferably extends over the entire cover plate 33.

Optionally and symbolized by a dashed line, an optical system 77 in the form of a converging lens can be located on an inner side of the cover plate 33, alternatively also on an outer side. Instead of a spherical converging lens, an aspherical lens, a free-form lens, a cylindrical lens or a Fresnel lens can also be used. The same is possible in all embodiments.

Figure 5:
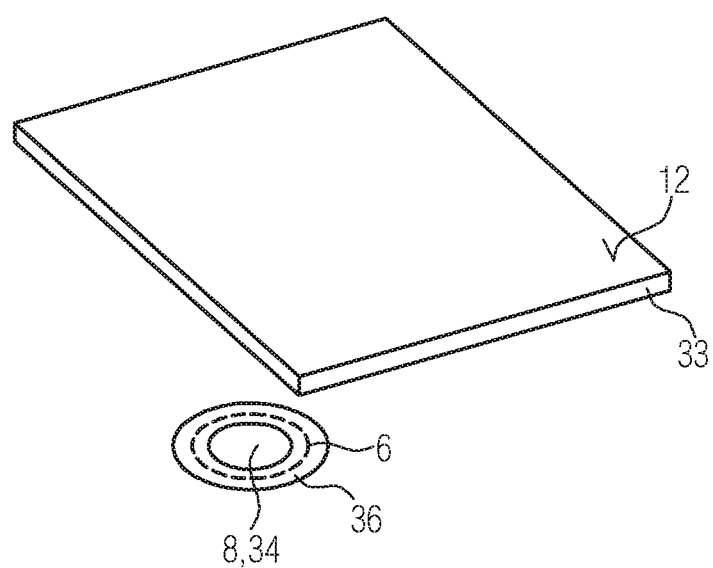
Figure 6:
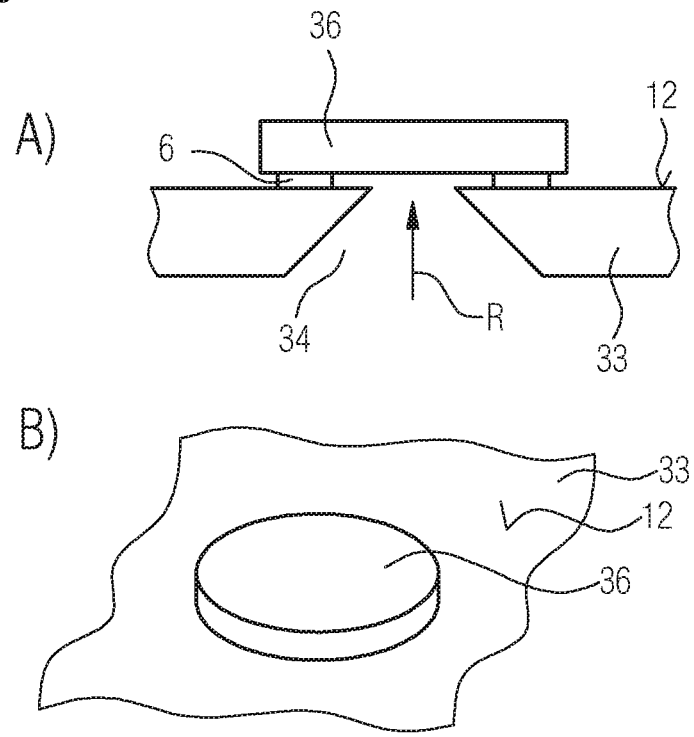

In the method step for producing the semiconductor component 1, as shown in the perspective view in FIG. 5, the cover plate 33 is a continuous, uninterrupted and radiation-permeable plane-parallel plate. On a side facing away from the component upper side 12, the luminescent material 36 is attached, for example, by means of adhesive bonding or soldering. For this purpose, in particular a metallic sealing frame 6 can be used on the luminescent material 36.

It is possible for the luminescent material 36 to be located only in the radiation exit region 34, so that no luminescent material 36 is present in the region of the sealing frame 6, but, for example, only one ceramic.

According to the sectional illustration in FIG. 6A and the perspective top view in FIG. 6B, the luminescent material 36 is a phosphor ceramic plate which is attached to the cover plate 33 in an exterior on the component upper side 12 via the sealing frame 6.

In FIG. 7, manufacturing steps for the hermetically sealed introduction of the luminescent material 36, for example, into the cover plate 33 are shown. According to the sectional view of FIG. 7A, a raw material 9 with the luminescent material 36 and optionally with a binder and a matrix material is introduced into the recess for the radiation exit region 34. Subsequently, the raw material 9 is cured and/or melted to constitute the region with the luminescent material 6.

A planarization is then preferably carried out, see FIG. 7B, so that the region with the luminescent material 36 terminates flush with the main sides of the cover plate 33 and thus also flush with the component upper side 12.

Further perspective illustrations of method steps for producing the semiconductor component 1 are illustrated in FIG. 8. According to FIG. 8A, a plurality of panels 31', 32', 33' each having a plurality of components 31, 32, 33 are provided. The panels 31', 32', 33' are arranged stacked one above the other, are heated together and are thus simultaneously connected to one another via the respective sealing frames 6.

Subsequently, a separation to the finished components 1 is carried out, see FIG. 8B.

In FIG. 8A, it is indicated that the sealing frames 6 can reach up to the side surfaces 13 of the housing 3, unlike, for example, in FIG. 1. In this case illustrated in FIG. 8A, the sealing frames 6 are preferably guided only with a conductor-track-like extension as far as the side surfaces 13. It is thus possible for the sealing frames 6 to form a continuous structure on the panels 31', 32', 33', which are not yet separated, as a whole, just as this can apply to the main sides of the panels 31', 32', 33' for the through-connections, not shown in FIG. 8A. As a result, the sealing frames 6 and/or the through-connections on the panels 31', 32', 33' can be produced or thickened by galvanic deposition. As a result of the separation step, the sealing frames 6 and/or the through-connections are then divided, so that no undesired short-circuits occur, in particular with regard to the through-connections, within the finished components 1.

In the exemplary embodiment of FIG. 9, the plane-parallel cover plate 33 as a whole is made of a transparent material, for example, of quartz glass. The recess 15 can thus be seen from outside the semiconductor component 1. Furthermore, the luminescent material 36 can be attached directly to the deflection optics 75 and not to the cover plate 33. In order to simplify the illustration, the through-connections are not shown in FIG. 9, just as little as in FIG. 10.

An arrangement similar to FIG. 9 is illustrated in the exploded perspective drawing of FIG. 10. In contrast to FIG. 9, the luminescent material 36, for example, constructed as illustrated in FIG. 5, can be attached directly to the cover plate 33. The cover plate 33 may in turn be a plane-parallel, light-permeable plate.

Unless indicated otherwise, the components shown in the figures follow one another in each case directly in the specified sequence. Layers which are not in contact in the figures are preferably spaced apart from one another. If lines are drawn parallel to one another, the corresponding surfaces are preferably likewise aligned parallel to one another. Likewise, unless indicated otherwise, the relative positions of the illustrated components with respect to one another are correctly reproduced in the figures.

The invention described here is not limited by the description with reference to the exemplary embodiments. Rather, the invention comprises each novel feature and any combination of features, including in particular any combination of features in the claims, even if this feature or combination itself is not explicitly recited in the claims or embodiments.

This patent application claims the priority of German patent application 10 2017 123 413.6, the disclosure content of which is hereby incorporated by reference.

LIST OF REFERENCE SYMBOLS 1 optoelectronic semiconductor component
11 component underside
12 component upper side
13 housing side surface
15 recess
2 semiconductor chip
3 housing
31 base plate
32 housing ring
33 cover plate
34 radiation exit region
35 electrical contact surface
36 luminescent material
4 electrical connection surface
51 electrical through-connection
52 bonding wire
53 electrical connecting means
54 conductor track
6 metallic sealing frame
71 driver/submount
72 integrated circuit
73 monitor diode
74 control circuit
75 deflection optics
76 control unit for the radiation exit region
77 optical system
8 testing device
9 raw material
R radiation

The invention claimed is:
1. An optoelectronic semiconductor component comprising at least one semiconductor chip for generating radiation and an inorganic housing, wherein
the semiconductor chip is accommodated in a hermetically sealed manner in the housing,
the housing comprises a base plate, a cover plate and at least one housing ring between the base plate and the cover plate, and a plurality of electrical through-connections, a recess is formed by the at least one housing ring, the semiconductor chip is located in said recess, the base plate has a plurality of electrical connection surfaces at a component underside, in each case a plurality of the through-connections extend through the base plate, through the cover plate and through the at least one housing ring in a direction transverse to the component underside, the base plate, the at least one housing ring and the cover plate are firmly connected to one another via continuous, peripheral inorganic sealing frames, and the housing comprises a radiation exit region for the emission of radiation.

2. The optoelectronic semiconductor component according to claim 1, which comprises a plurality of the housing rings, wherein the housing rings are arranged in a stacked manner one above the other and are formed differently from one another in a region of the recess when seen in plan view and are fixedly connected to one another by the sealing frames which are metallic sealing frames, wherein at least two of the through-connections extend at a distance from the recess and are electrically insulated from the recess, and wherein the base plate and the housing rings are each made of a ceramic and the cover plate comprises at least one of a ceramic and a glass.

3. The optoelectronic semiconductor component according to claim 2, wherein one of the housing rings is a mounting platform for the semiconductor chip such that the semiconductor chip is mounted on said housing ring.

4. The optoelectronic semiconductor component according to claim 2, wherein in each case at least one electrical contact surface is attached to each of the housing rings in the recess, wherein these electrical contact surfaces are oriented parallel to the component underside.

5. The optoelectronic semiconductor component according to claim 1, wherein a plurality of electrical contact surfaces are located in the recess both on the base plate and on the cover plate, said contact surfaces being electrically connected directly or indirectly to the semiconductor chip.

6. The optoelectronic semiconductor component according to claim 1, wherein one or more of the following components are located in the recess: a driver for the semiconductor chip, an integrated circuit, a monitor diode, a control circuit for power regulation of the semiconductor chip, a control unit for the radiation exit region.

7. The optoelectronic semiconductor component according to claim 1, wherein, seen in plan view, the radiation exit region occupies at most 10% of a base surface of the cover plate, wherein the radiation exit region is surrounded by the cover plate.

8. The optoelectronic semiconductor component according to claim 1, wherein the radiation exit region comprises a luminescent material for partially or completely converting a radiation produced by the semiconductor chip during operation, wherein the semiconductor chip is a laser diode.

9. The optoelectronic semiconductor component according to claim 1, wherein a testing device is mounted on a side of the radiation exit region facing away from the at least one housing ring, the testing device is configured to determine whether the radiation exit region is intact, wherein the testing device operates electrically.

10. The optoelectronic semiconductor component according to claim 9, wherein the radiation exit region is located in the cover plate, wherein the testing device is formed by a meandering electrical conductor track which is permeable to the radiation generated by the semiconductor chip during operation, and wherein this conductor track is electrically connected to at least one of the electrical connection surfaces on the component underside via at least one of the through-connections.

11. The optoelectronic semiconductor component according to claim 1, further comprising deflecting optics which are accommodated in the recess, wherein during operation the semiconductor chip emits the radiation with a tolerance of at most 30° in the direction parallel to the base plate and the deflection optics deflect radiation generated by the semiconductor chip during operation in the direction perpendicular to the base plate.

12. The optoelectronic semiconductor component according to claim 1, wherein the base plate and the cover plate are continuous, plane-parallel plates and around the recess the at least one housing ring has a constant thickness perpendicular to the component underside, wherein the sealing frames comprise one or more of these metals: Ag, Au, Bi, Cu, In, Ni, Sn, Zn.

13. The optoelectronic semiconductor component according to claim 1, wherein side surfaces of the housing are free of electrically conductive materials, wherein the housing is cuboid, and wherein the base plate and the cover plate each have a thickness of between 0.1 mm and 1.5 mm inclusive and are made of a material having a specific thermal conductivity of at least 20 W/m·K.

14. The optoelectronic semiconductor component according to claim 1, wherein coefficients of thermal expansion of the base plate, the cover plate and the at least one housing ring differ from one another by at most $1\times10^{-5}$ 1/K, and wherein the sealing frames and an electrical connecting means, by means of which the semiconductor chip is fastened, are thermally stable at a temperature of 260° C. for at least 30 s, such that the semiconductor component is configured to be fastened by means of surface mounting technology.

15. A production method for an optoelectronic semiconductor component according to claim 1, comprising the steps of:

A) providing the base plate, the at least one housing ring and the cover plate one above the other, wherein the base plate is provided on a side facing the cover plate and the cover plate is provided on a side facing the base plate and the at least one housing ring is provided on both sides in each case with one of the sealing frames, and B) connecting the base plate, the at least one housing ring and the cover plate to one another in a fixed manner by simultaneously connecting all adjacent sealing frames to one another.

16. The method according to claim 15, wherein steps A) and B) are carried out in a wafer composite, and in a subsequent step C) a separation into the semiconductor components takes place.

\* \* \* \* \*